(12) United States Patent  
Bopp

(10) Patent No.: US 8,477,504 B2
(45) Date of Patent: Jul. 2, 2013

(54) SYSTEMS AND METHODS FOR BLIND-MATE CONNECTOR ALIGNMENT

(75) Inventor: Jayson K. Bopp, Fishers, IN (US)

(73) Assignee: Raytheon Company, Waltham, MA (US)

( * ) Notice: Subject to any disclaimer, the term of this patent is extended or adjusted under 35 U.S.C. 154(b) by 1154 days.

(21) Appl. No.: 12/366,258

(22) Filed: Feb. 5, 2009

(65) Prior Publication Data

US 2010/0081307 A1   Apr. 1, 2010

Related U.S. Application Data

(60) Provisional application No. 61/194,891, filed on Sep. 30, 2008, provisional application No. 61/195,187, filed on Oct. 2, 2008.

(51) Int. Cl.
*H05K 5/00* (2006.01)
(52) U.S. Cl.
USPC ............... 361/728; 244/118.5; 312/223.1
(58) Field of Classification Search
USPC ............... 700/83; 361/681, 679.01, 679.02, 361/728–731; 244/971, 1 N, 220, 118.5
See application file for complete search history.

(56) References Cited

U.S. PATENT DOCUMENTS 3,981,199 A   9/1976   Moore et al.
4,093,021 A   6/1978   Groom (Continued)

FOREIGN PATENT DOCUMENTS

DE   35 17 149 A1   5/1985
EP   0 098 090      6/1983

(Continued)

OTHER PUBLICATIONS

Patent Cooperation Treaty, Notification of Transmittal of the International Search Report and the Written Opinion of the International Searching Authority, or the Declaration, PCT Rule 44.1) International Application No. PCT/US2009/033376, 15 pages, Mailed Nov. 19, 2009.

(Continued)

*Primary Examiner* — Benjamin P Lee
(74) *Attorney, Agent, or Firm* — Renner, Otto, Boisselle & Sklar, LLP

(57) ABSTRACT

In accordance with the teachings of the present disclosure, systems and methods for aligning blind-mate connectors are provided. In one embodiment, a system comprises an avionics processing canister that is coupled to a mounting block. The avionics processing canister comprises a first portion of a first blind-mate connector, and a face plate with a surface that defines a pin-hole and a slot. The slot has a short dimension substantially equal to the diameter of the pin-hole and a long dimension perpendicular to the short dimension. The long dimension is longer than the short dimension. The system also comprises a first fastener that is received through the pin-hole and then into a first hole defined by a surface of the mounting block. The pin-hole has a diameter that is substantially equal to an outer diameter of the first fastener. The system also comprises a second fastener that is received through the slot and then into a second hole defined by a surface of the mounting block. The slot is oriented such that the second fastener constrains rotation of the face plate about a center of the pin-hole to align the first portion of the first blind-mate connector to a second portion of the first blind-mate connector.

20 Claims, 8 Drawing Sheets

U.S. PATENT DOCUMENTS

| | | | |
|---|---|---|---|
| 4,312,041 A | 1/1982 | DeJonge | |
| 4,532,513 A | 7/1985 | Halvorson | |
| 4,699,208 A | 10/1987 | Wolf et al. | |
| 5,467,085 A * | 11/1995 | Dunn | 340/971 |
| 5,786,995 A * | 7/1998 | Coleman | 700/83 |
| 5,942,691 A | 8/1999 | Hopkins et al. | |
| 6,027,239 A * | 2/2000 | Ghassaei | 700/279 |
| 6,549,424 B1 * | 4/2003 | Beseth et al. | 361/801 |
| 6,587,056 B1 * | 7/2003 | Fraser et al. | 340/945 |
| 7,178,390 B1 | 2/2007 | Kalovsky et al. | |
| 7,188,400 B1 | 3/2007 | Beseth et al. | |
| 7,417,866 B1 * | 8/2008 | Beseth et al. | 361/732 |
| 7,885,056 B2 * | 2/2011 | Bopp | 361/679.01 |
| 8,085,168 B2 * | 12/2011 | Bethel | 340/971 |
| 8,238,106 B2 * | 8/2012 | Vicich et al. | 361/728 |
| 2004/0165341 A1 * | 8/2004 | Dent | 361/679 |
| 2006/0060732 A1 | 3/2006 | Tannas Jr. | |
| 2008/0094255 A1 | 4/2008 | Bethel | |
| 2008/0298004 A1 * | 12/2008 | Bailey et al. | 361/683 |
| 2010/0090868 A1 * | 4/2010 | Hall | 340/971 |
| 2011/0065303 A1 * | 3/2011 | Petrisor | 439/297 |

FOREIGN PATENT DOCUMENTS

| | | |
|---|---|---|
| GB | 1 274 311 | 1/1969 |
| WO | WO 98/21093 | 5/1998 |
| WO | WO 0100435 A1 * | 1/2001 |
| WO | WO 03/080437 A2 | 10/2003 |
| WO | WO 2007/086822 A2 | 8/2007 |
| WO | WO 2008/040783 | 4/2008 |
| WO | WO 2008/101167 | 8/2008 |

OTHER PUBLICATIONS

U.S. Appl. No. 12/366,540, filed Feb. 5, 2009, entitled "Canister Housing"; Jayson K. Bopp, et al. inventors (31 pages).

Patent Cooperation Treaty, Notification of Transmittal of the International Search Report and the Written Opinion of the International Searching Authority, or the Declaration, PCT Rule 44.1) International Application No. PCT/US2009/033381, 12 pages, Mailed Jul. 16, 2009.

Patent Cooperation Treaty, Notification of Transmittal of the International Search Report and the Written Opinion of the International Searching Authority, or the Declaration, PCT Rule 44.1) International Application No. PCT/US2009/033376, 7 pages, Mailed Jul. 17, 2009.

Notification of Transmittal of the International Search Report and the Written Opinion of the International Searching Authority, International Application No. PCT/US2009/033371, Filing Date Jun. 2, 2009, 16 pages, Sep. 22, 2013.

Jayson K. Bopp; "Center Instrument Pedestal Display;" U.S. Appl. No. 12/366,451; 32 pages, Filed Feb. 5, 2009.

Vicich, et al; "Aircraft Canister Design;" U.S. Appl. No. 12/366,556; 32 pages, Filed Feb. 5, 2009.

Bopp, et al.; "Apparatus for Supporting Instruments in an Instrumental Panel;" U.S. Appl. No. 12/366,148; 26 pages, Filed Feb. 5, 2009.

Patent Cooperation Treaty, Notification of Transmittal of the International Search Report and the Written Opinion of the International Searching Authority, or the Declaration, PCT Rule 44.1) International Application No. PCT/US2009/033374, 14 pages, Mailed Jan. 20, 2010.

* cited by examiner

SYSTEMS AND METHODS FOR BLIND-MATE CONNECTOR ALIGNMENT

RELATED APPLICATIONS

This application claims the benefit under 35 U.S.C. §119(e) of U.S. Provisional Application Nos. 61/194,891 filed Sep. 30, 2008, entitled "F-16 Center Pedestal Display Housing" and 61/195,187, filed Oct. 2, 2008, entitled "Aircraft Avionics and Mission Computer Processing Canister Design."

TECHNICAL FIELD

This disclosure relates in general to aircraft instrumentation and more particularly to an aircraft center instrument pedestal display.

BACKGROUND

In some aircraft, such as F-16, F-15, and F-22 fighter jets, a center instrument pedestal comprises components such as instruments, gauges, and/or switches that provide information and functionality to a pilot. For example, the components may comprise altimeters, airspeed indicators, directional gyroscopes, vertical velocity indicators, navigation mode selectors, and fuel switches.

SUMMARY

In accordance with the teachings of the present disclosure, systems and methods for aligning blind-mate connectors are provided. In one embodiment, a system comprises an avionics processing canister that is coupled to a mounting block. The avionics processing canister comprises a first portion of a first blind-mate connector, and a face plate with a surface that defines a pin-hole and a slot. The slot has a short dimension substantially equal to the diameter of the pin-hole and a long dimension perpendicular to the short dimension. The long dimension is longer than the short dimension. The system also comprises a first fastener that is received through the pin-hole and then into a first hole defined by a surface of the mounting block. The pin-hole has a diameter that is substantially equal to an outer diameter of the first fastener. The system also comprises a second fastener that is received through the slot and then into a second hole defined by a surface of the mounting block. The slot is oriented such that the second fastener constrains rotation of the face plate about a center of the pin-hole to align the first portion of the first blind-mate connector to a second portion of the first blind-mate connector.

Numerous technical advantages are provided according to various embodiments of the present disclosure. In certain embodiments, the position of a portion of a blind-mate connector may be controlled within acceptable tolerances. With a portion of one or more blind-mate connectors being known, a display head may be connected directly to one or more avionics instrument canisters. The canisters may perform functions to allow a pilot to view situational awareness and other flight and/or combat information on a digital display. The information displayed to the pilot may be provided by legacy instrumentation currently existing on an aircraft's center pedestal housing, as well as additional information not capable of being derived from the existing legacy instruments.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure, and for further features and advantages thereof, reference is now made to the following description taken in conjunction with the accompanying drawings, in which.

DETAILED DESCRIPTION

In some aircraft, such as F-16, F-15, and F-22 fighter jets, a center instrument pedestal comprises components such as instruments, gauges, and/or switches that provide information and functionality to a pilot. Components may be removed and installed in order to replace failed components, upgrade existing capabilities, or add new capabilities. For example, analog components may be upgraded to digital components. As another example, new components may be added to upgrade an aircraft's situational awareness capabilities.

Replacing the components may involve removing old components and installing new components. In some embodiments, the new components may be installed in the existing center instrument pedestal without modifying the space and design parameters of the cockpit. Because the new components may include blind-mate connectors they should be precisely positioned within the center instrument pedestal of the aircraft to ensure proper matting with corresponding blind-mate connectors.

Embodiments of the present invention and their advantages are best understood by referring to FIGS. 1 through 6B of the drawings, like numerals being used for like and corresponding parts of the various drawings.

Figure 1:
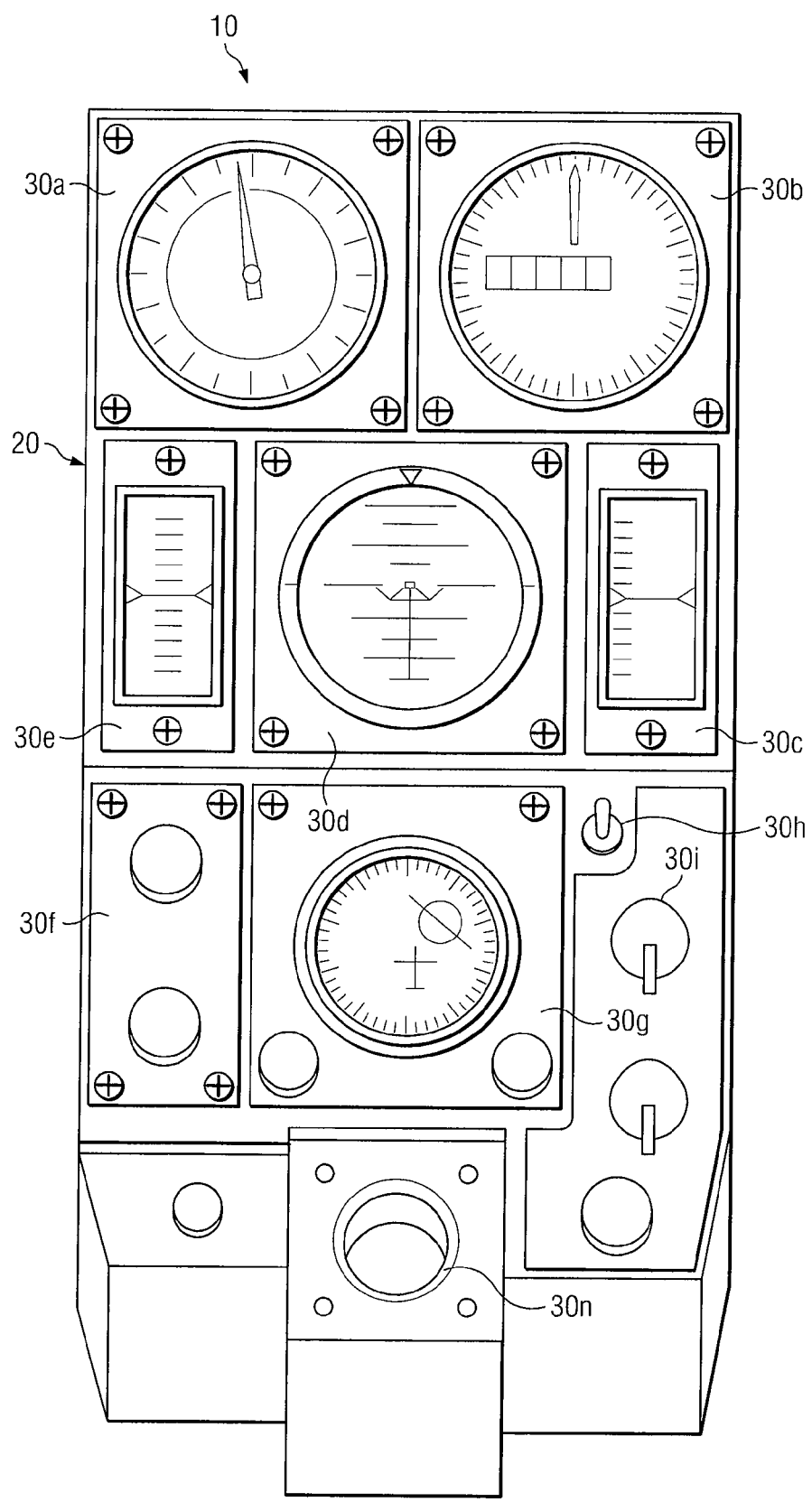
FIG. 1 illustrates an example of a center instrument pedestal of an aircraft including legacy instruments whose functions may be replaced in accordance with embodiments of the present disclosure.

FIG. 1 illustrates an example of a front view of a center instrument pedestal 10 for an F-16 aircraft. In some embodiments, center instrument pedestal 10 comprises a mounting block 20 and components 30. For example, components 30 may comprise altimeters, airspeed indicators, directional gyroscopes, vertical velocity indicators, navigation mode selectors, and fuel switches. As illustrated in FIG. 1, components 30 comprise legacy components. It should be understood, however, that components 30 secured to mounting block 20 may be any type of components, such as new components, replacement components, legacy components, or a combination of any of the preceding.

Although FIG. 1 illustrates a particular embodiment that includes particular components that are each configured to provide certain functionality, alternative embodiments may include any appropriate combination of components with the described functionality divided between the components in any suitable manner. For example, alternative embodiments may comprise other types of aircraft which may have different dimensions. It should be understood that the dimensions may be different for other types of aircraft.

Figure 2A:
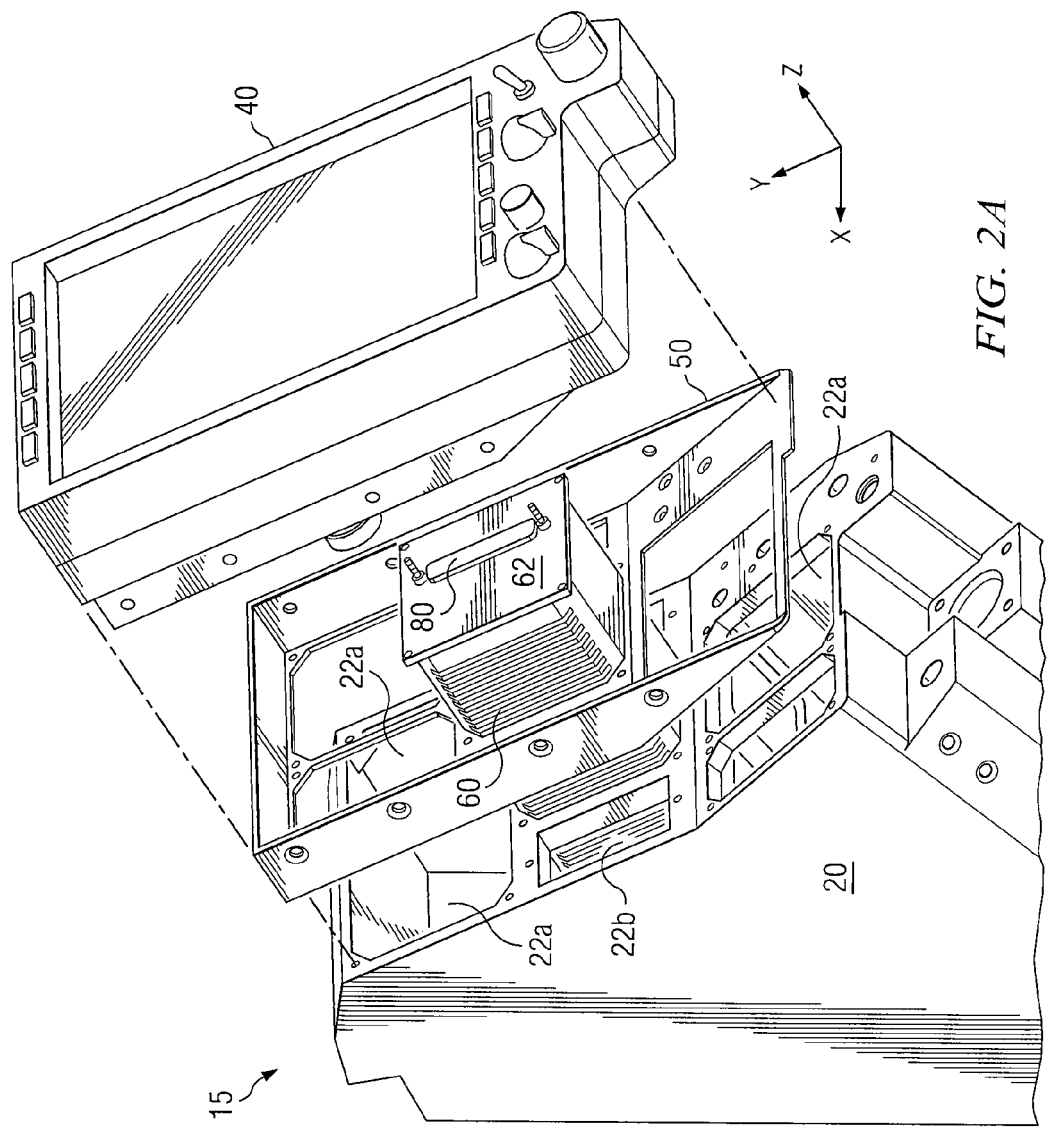
FIGS. 2A and 2B illustrate an example of an exploded isometric view of a center instrument pedestal according to some embodiments.
Figure 2B:
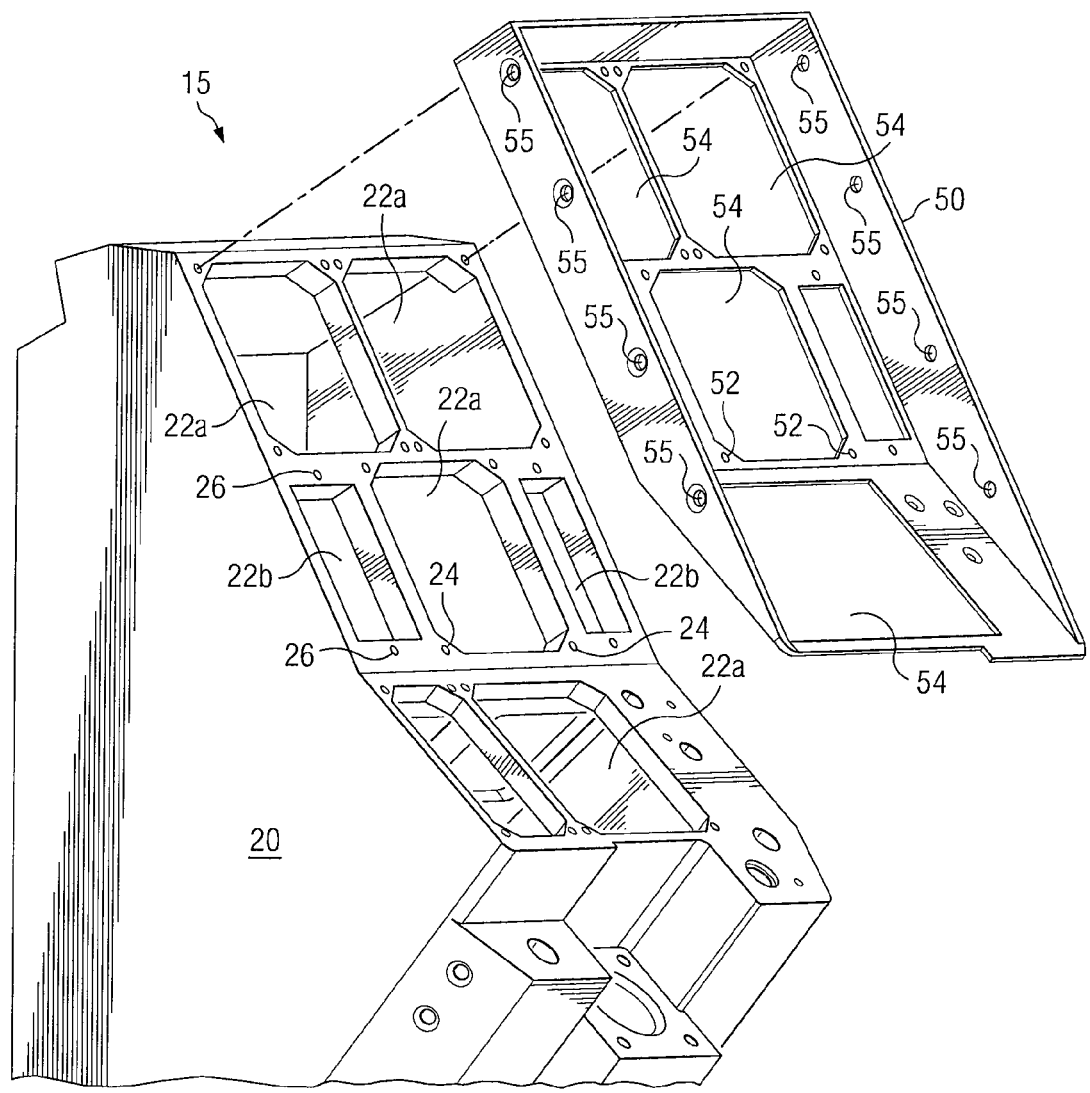

FIGS. 2A and 2B illustrate an exploded isometric view of a system 15 for aligning blind-mate connectors in accordance with an embodiment of the present disclosure. FIG. 2A illustrates a mounting block 20, a display adapter mount 50, an avionics canister 60, and a display head 40. FIG. 2B illustrates mounting block 20 and display adapter mount 50 with canister 60 and display head 40 removed to reveal certain features of mounting block 20 and display adapter mount 50.

In some embodiments, display head 40 may receive signals from canister 60 and generate a display from the signals. For example, display head 40 may receive signals from instruments and generate a display based on that information. The information, such as altitude, airspeed, direction, vertical velocity, and/or any other suitable information, may be used by a pilot operating an aircraft. Display head 40 may be secured to display adapter mount 50. In some embodiments, canister 60 may be inserted into mounting block 20 through display adapter mount 50 as illustrated by FIG. 2A.

FIG. 2A illustrates the assembly of certain components of system 15 in accordance with an embodiment of the present disclosure. In certain embodiments, display adapter mount 50 may be mounted to mounting block 20, and canister 60 may be inserted through display adapter mount canister aperture 54 and cavity 22a of mounting block 20 and secured to mounting block 20. Canister 60 also may include a male blind-mate connector that connects to a corresponding female blind-mate connector on display head 40. It should be understood that male and female blind-mate connectors are interchangeable. Thus, female blind-mate connectors may be part of canister 60 and male blind-mate connectors may be part of display head 40.

Embodiments of canister 60 may be installed in the existing center instrument pedestal without modifying the structure of the aircraft. Specifically, the dimensions of canister 60 may be such that canister 60 may fit through a cavity 22a of mounting block 20. Thus, embodiments of canister 60 may permit an aircraft to be upgraded from within the cockpit. Additionally, embodiments of canister 60 may be designed such that installing canister 60 does not alter the weight and/or center of gravity of a loaded center instrument pedestal. Canister 60 may also be designed using existing shock and vibration requirements for F-16 multi-function display (MFD).

In certain embodiments, canister 60 may generally provide a platform to host digital flight instruments and/or enhanced processing capabilities for mission planning and/or control. Such flight instruments and/or processing capabilities may provide feedback and/or situational awareness capabilities that may or may not be provided by legacy instruments 30. Accordingly, canister 60 may provide additional or different capabilities over legacy instruments 30, while maintaining space and design parameters for an aircraft cockpit.

In some embodiments, canisters 60 may be installed to provide certain functionality. For example, a particular canister 60 may provide processing capabilities and comprise a primary flight reference (PFR) unit or an image capture unit (ICU). As another example, a canister 60 may function to provide power to a center instrument pedestal and comprise a power distribution unit (PDU).

As illustrated in FIG. 2B, mounting block 20 may be a casting that is located in the center of a cockpit of an aircraft, such as an F-16 fighter plane. In accordance with embodiments of the present disclosure, legacy instruments 30 may be removed from mounting block 20 and canisters 60 and display head 40 may replace the functionality of certain legacy instruments 30. It may be desirable to replace legacy instruments 30 without modification to mounting block 20.

Mounting block 20 may include four cavities 22a, each of which may receive a canister 60. In a standard F-16 mounting block, the dimension of cavities 22a may be approximately 3.0 to 3.50 inches square. Canister 60 may have dimensions that allow one or more of canisters 60 to be inserted in existing cavities 22a and secured to canister mounting holes 24 that may be pre-existing in mounting block 20. In certain embodiments, two canisters 60 may be included in system 15, and in other embodiments three or more canisters may be included in system 15.

Mounting block 20 may also include mounting block cavities 22b which may hold other avionic components adapted to provided data to display head 40, but may not be sized to receive canisters 60. Mounting block cavities 22b may have a width of one to two inches and a height of three to four inches.

In some embodiments, the front of mounting block 20 may face the cockpit of the aircraft and thus may be readily accessible to the pilot. Mounting block 20 may also include display adapter mount mounting holes 26.

Figure 6A:
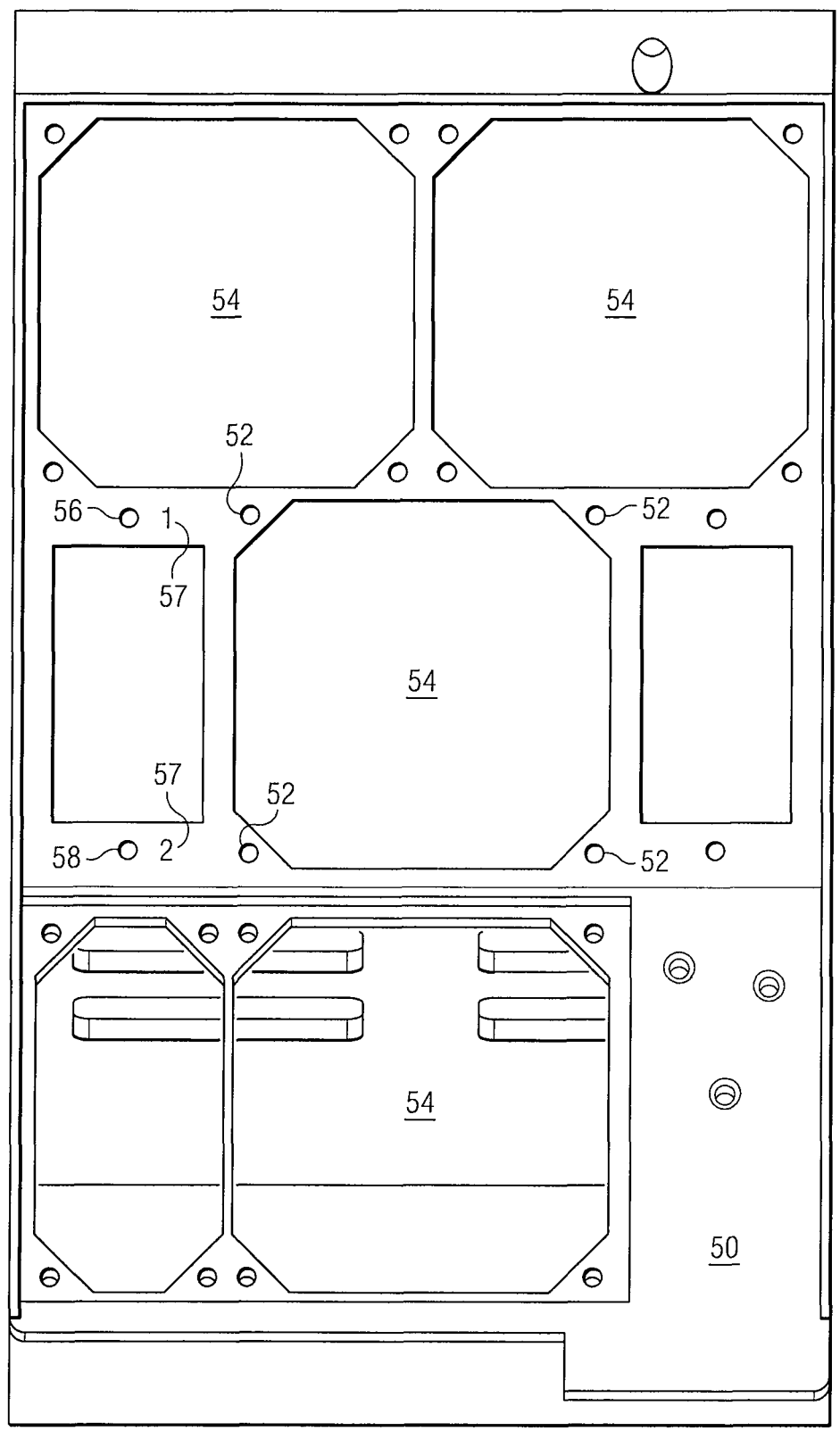
FIGS. 6A and 6B illustrate a front view of a display adapter mount positioned on top of a mounting block in accordance with embodiments of the present disclosure.
Figure 6B:
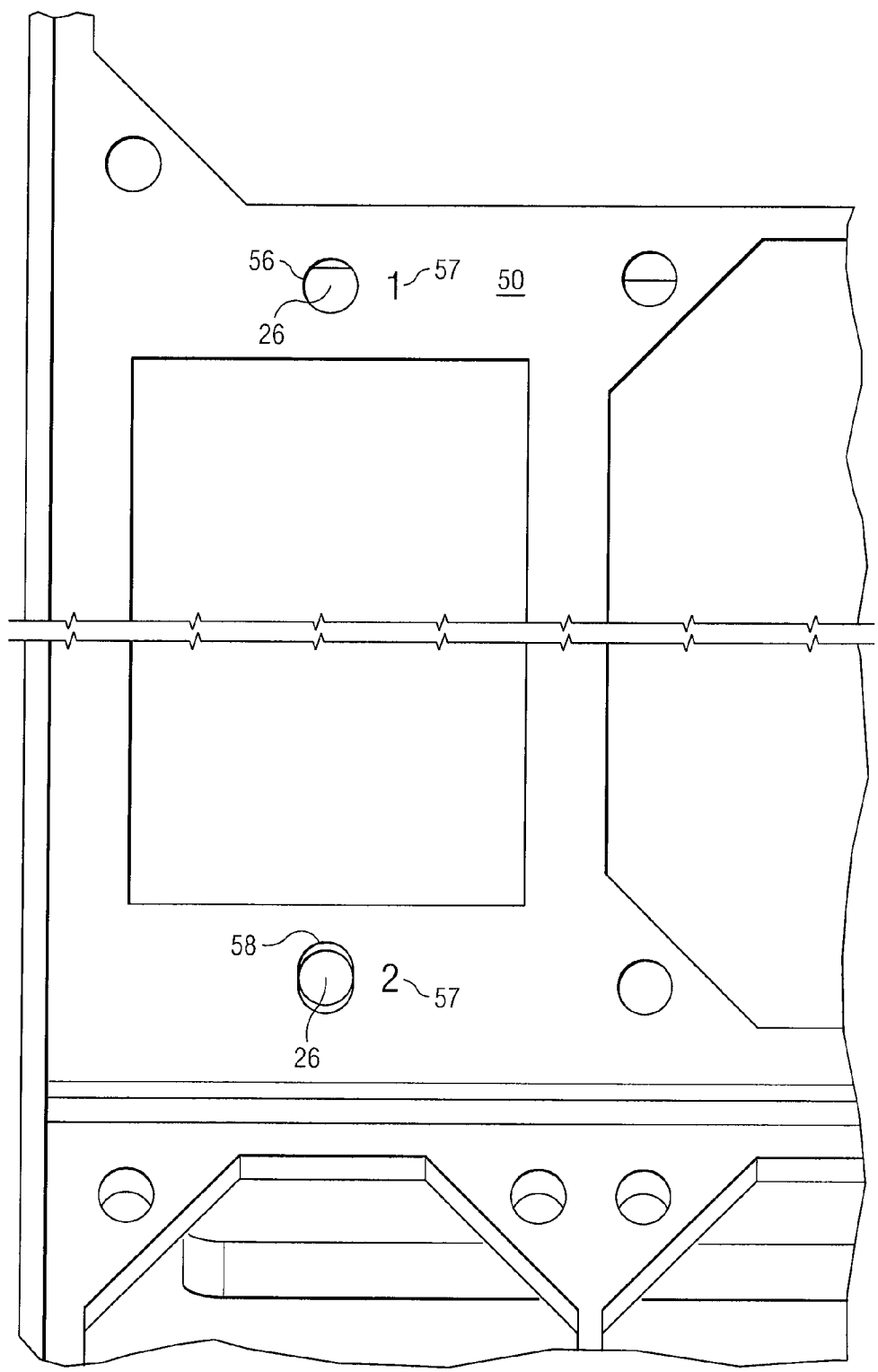

Display adapter mount 50 may be secured to mounting block using display adapter mount mounting holes 26 in accordance with the teachings of the present disclosure, as described in more detail herein with reference to FIGS. 6A and 6B.

Each canister mounting hole 24 and display adapter mount mounting hole 26 of mounting block 20 may be threaded holes sized to receive a certain size fastener or screw. In certain embodiments, canister mounting holes 24 and adapter mount mounting holes 26 may be sized to receive a 0.112-40 screw. However, any other suitable mechanical fastener, for example a quarter-turn fastener, a threaded stud, etc., may be used in accordance with the teachings of the present disclosure.

Display adapter mount 50 may have canister apertures 54. Each canister aperture 54 may be similar in size to mounting block cavities 22a to allow canisters 60 to be received through canister apertures 54 and mounting block cavities 22a when system 15 is assembled. Display adapter mount 50 may also have display adapter mount clearance holes 52. Display adapter mount clearance holes 52 may be non-threaded holes and may be sized to allow clearance to screws that mount canister 60 to mounting block 20. Display adapter mount 50 may also include display head mounting holes 55, which may receive a fastener that secures display head 40 to display adapter mount 50.

Figure 3A:
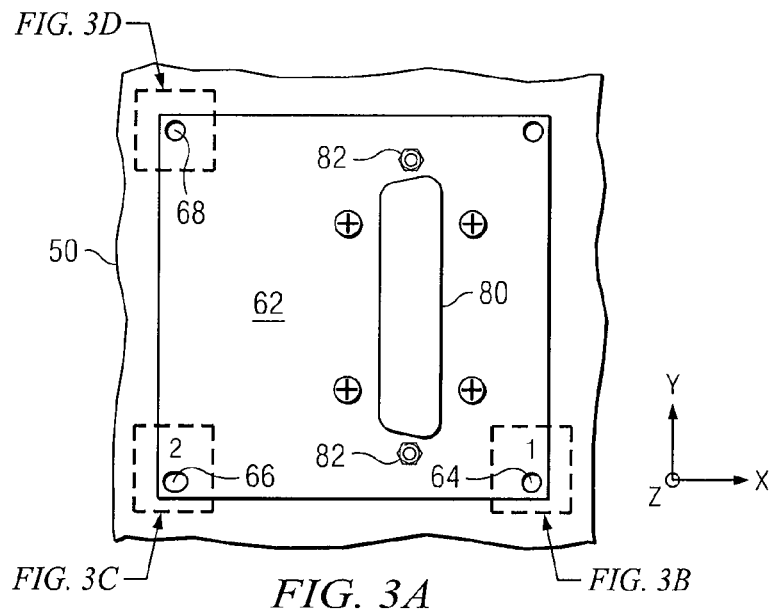
FIGS. 3A through 3D illustrate an example of a system for positioning a blind-mate connector according to some embodiments.

FIGS. 3A through 3D illustrate an example of a front view of a portion of system 15. FIG. 3A illustrates face plate 62 of canister 60 and display adapter mount 50 beneath face plate 62. Although not visible in FIG. 3A, display adapter mount 50 is on top of mounting block 20, as illustrated in the exploded view of FIG. 2A.

Canister 60 may include male blind-mate connector 80 protruding through face plate 62. Male blind-mate connector 80 may include guide posts 82 that may be adapted to receive a corresponding female blind-mate connector 104 of display head 40 (see FIG. 5). In particular embodiments, the location of male blind-mate connector 80 may be controlled to relatively tight tolerances. In certain embodiments, male blind-mate connector 80 may be misaligned by approximately 0.030 inches and still mate with corresponding female blind-mate connector 100 (see FIG. 5). By accurately positioning face plate 62 and securing canister 60 to mounting block 20 in accordance with the teachings of the present disclosure, the position of male blind-mate connector 80 may be within acceptable tolerances.

To properly position male blind-mate connector 80 to ensure proper connection with female blind-mate connector 100, all six degrees of freedom of canister 60 should be constrained. In accordance with certain embodiments, face plate 62 constrains the movement of canister 60 in the Z direction and the rotation of canister 60 about the X and Y axes. Face plate 62 may be positioned generally flush with display adapter mount 50, and a fastener through a pin hole 64 may be used to constrain canister 60 in the X and Y directions.

Figures 3B, 3C:
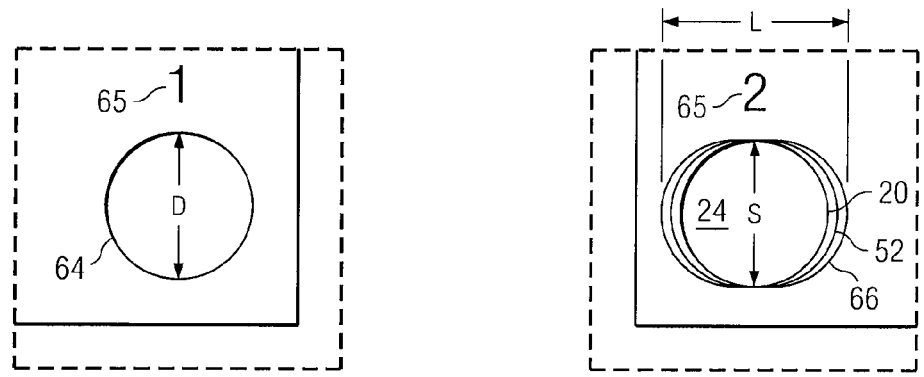

FIG. 3B illustrates pin hole 64 of face plate 62. The location of pin hole 62 may be accurate to five-thousandths of an inch. The diameter D of pin hole 64 may be selected to constrain canister 60 in the X and Y directions. In particular embodiments, the diameter D of pin hole 64 may be up to and including 0.500 inches, for example diameter D may be 0.112 inches. When pin hole 64 receives a fastener, for example a 0.112-40 screw, a pin fit may be created. In certain embodiments, the fastener may be a ¼-20 screw. In other embodiments, the fastener may be a 0.060-80 or a 0.086-56 screw.

The pin fit may occur because the diameter D of pin hole 64 may be substantially equal to the thread diameter of the fastener or screw used to secure face plate 62 to mounting block 20. Thus, for example, a fastener or screw received by pin hole 64 may have a thread diameter of approximately 0.112 inches. In accordance with an embodiment, the screw threads may touch the surface of pin hole 64 as the screw is threaded into the corresponding canister mounting hole 24 in mounting block 20.

After pin hole 64 receives a fastener or screw threaded into canister mounting hole 24 of mounting block 20, a second screw may be received through slot 66 of face plate 62 and threaded into a second canister mounting hole 24. FIG. 3C is a magnified view of the portion of system 15 shown in FIG. 3A. As illustrated, slot 66 may have a short dimension S and a long dimension L. Short dimension S may be the same diameter as pin hole 64, such as 0.112 inches. Long dimension L may be longer than short dimension S and may also be up to and including 0.500 inches, for example 0.136 inches. Long dimension L may allow for clearance of a screw in accordance with the teaching of the present disclosure.

If short dimension S is equal to the outer dimension of the threads of a screw, a pin fit may be created to constrain the rotation of canister 60 about the Z axis. More particularly, the pin fit may constrain the motion of canister 60 about a center of pin hole 64.

Slot 66 includes a long dimension L that is longer than short dimension S, so face plate 62 is not over-constrained and may expand or contract without being damaged if it is subjected to a temperature variation.

FIG. 3C is a magnified view of a front view of a portion of system 15 showing face plate 62, display adapter mount 50, and mounting block 20. Thus, the edge of display adapter mount clearance hole 52 is visible. Mounting block 20 is also visible in FIG. 3C along with canister mounting hole 24. Numerals 65 on face plate 62 may indicate a fastener order. That is, pin hole 64 may receive a fastener first, then slot 66 may receive a fastener second.

Figure 3D:
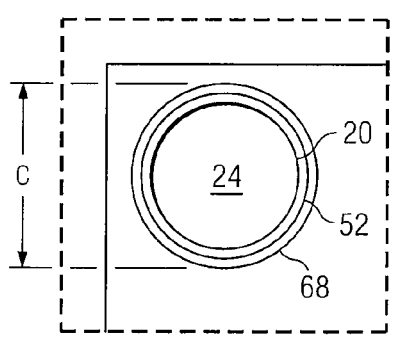

FIG. 3D illustrates a clearance hole 68 in face plate 62. Clearance hole 68 may have a standard clearance dimension D for example approximately 0.136 inches. Additional fasteners or screws received through clearance hole 68 of face plate 62 may provide additional mechanical strength and secure canister 60 to mounting block 20 without adding additional mechanical constraints. FIG. 3D also shows an edge of display adapter mount clearance hole 52, mounting block 20, and canister mounting hole 24.

Figure 4:
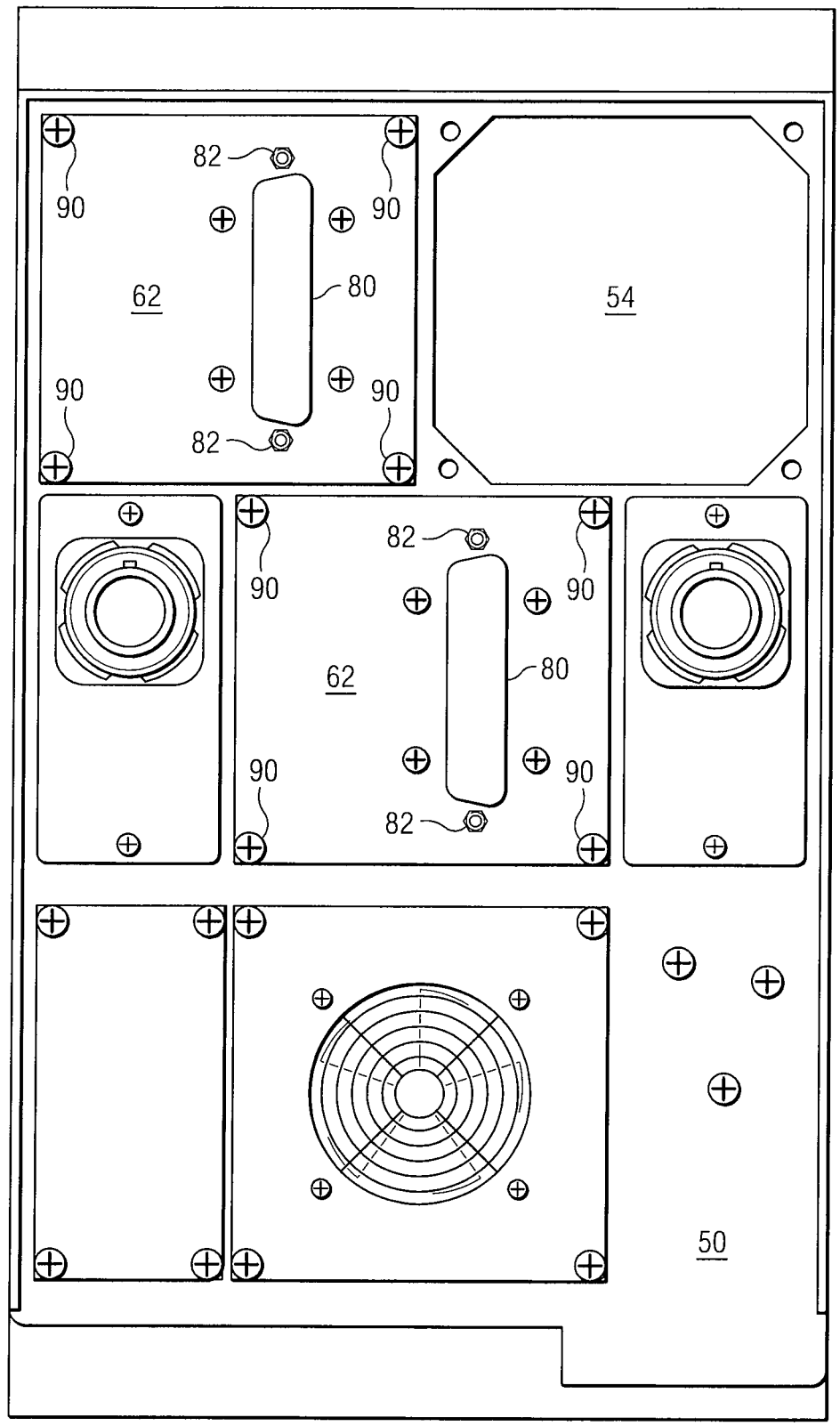
FIG. 4 illustrates a system showing blind-mate connectors positioned in accordance with the teachings of the present disclosure.

FIG. 4 illustrates a front view of system 15 including two canisters 60, each including a male blind-mate connector 80. Fasteners or screws 90 are illustrated as received through face plate 62 to secure canisters 60 to mounting block 20 in accordance with embodiments of the present disclosure. System 15 may also include an additional display adapter mount canister apertures 54, which may be configured to receive additional canisters 60. In certain embodiments, display adapter mount canister aperture 54 may be adapted to receive a cooling fan 104 located on display head 40 (see FIG. 6). In some embodiments a shroud may be positioned and secured to mounting block 20 in accordance with the teachings of the present disclosure. A shroud may ensure that cooling fan 104 does not re-circulate air, but rather efficiently draws heat from system 15.

Figure 5:
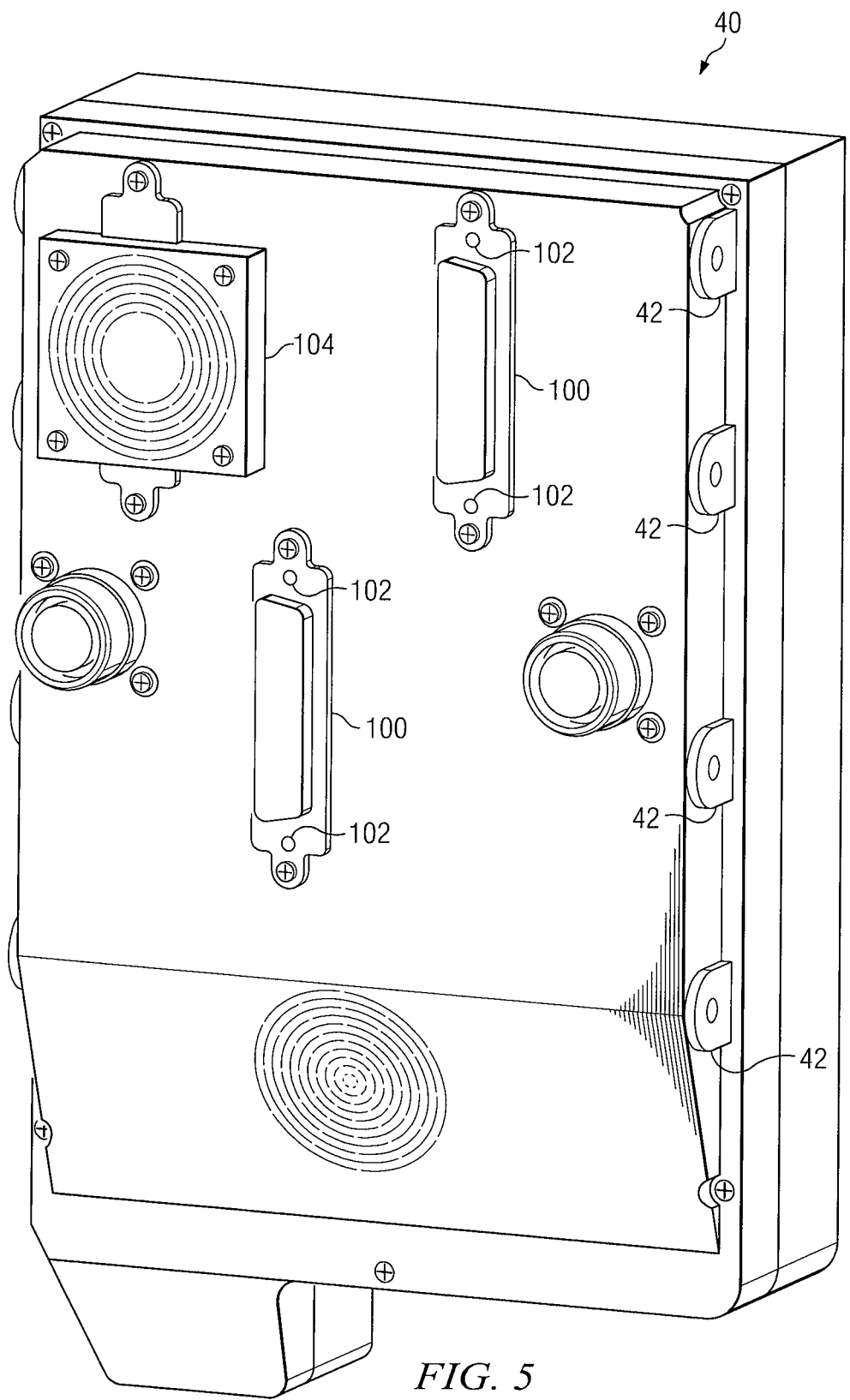
FIG. 5 illustrates a rear view of a display head showing blind-mate connectors according to some embodiments.

FIG. 5 illustrates a rear isometric view of display head 40. Display head 40 includes female blind-mate connectors 100 and cooling fan 104. Female blind-mate connectors 100 may connect with male blind-mate connectors 80 when male blind-mate connectors 80 are properly positioned and constrained to mounting block 20 in accordance with embodiments of the present disclosure. For example, guide pins 82 may be received by guide pin receptacles 102, and female blind-mate connector 100 may be precisely positioned by guide pins 82 to connect and interface with male blind-mate connectors 80. Display head 40 may also include display head ears 42 that allow display head 40 to be secured to display adapter mount 50.

FIGS. 6A and 6B illustrate a front view of display adapter mount 50 positioned on top of mounting block 20. Display adapter mount 50 may include multiple display adapter mount canister apertures 54 for receiving canisters 60 or other components of system 15. Display adapter mount 50 also includes display adapter mount clearance holes 52, as described with reference to FIGS. 3C and 3D.

Display adapter mount 50 may be secured to mounting block 20 with all six degrees of freedom constrained. This may be accomplished by inserting a screw through display adapter mount pin hole 56 into display adapter mount mounting holes 26, which may be threaded holes in mounting block 20.

Display adapter mount pin hole 56 may provide a pin fit because the diameter of adapter mount pin hole may be equal to the thread diameter of a fastener or screw used to secure display adapter mount 50 to mounting block 20. Display adapter mount 50 may be secured to mounting block similarly to the system and method described herein for securing canister 60 to mounting block 20.

Display adapter mount 50 may include display adapter mount slot 58 which may have a short dimension that is equal to the outer diameter of a fastener or screw used to secure display adapter mount 50 to mounting block 20. In this respect, a pin fit in the direction of the short dimension may be achieved. Display adapter mount slot 58 may also include a long dimension which may allow a clearance that ensures that display adapter mount 50 is not over-constrained. Thus, display adapter mount 50 may not be damaged if it is subjected to thermal expansion and contraction as was discussed with respect to face plate 62. Display adapter mount 50 may also include numerals 57 that may indicate an order that fasteners or screws should be inserted to secure display adapter mount 50 to mounting block 20.

Although embodiments of the present invention and their advantages have been described in detail, it should be understood that various changes, substitutions, and alterations can be made therein without departing from the spirit and scope of the invention as defined by the appended claims.

What is claimed is:

1. An apparatus, comprising:
an avionics processing canister coupled to a mounting block, the avionics processing canister comprising:
a face plate with a surface that defines a pin-hole and a slot, the slot having a short dimension substantially equal to a diameter of the pin-hole and a long dimension perpendicular to the short dimension, the long dimension being longer than the short dimension; and
a first portion of a first blind-mate connector;
a first fastener received through the pin-hole and then into a first hole defined by a surface of the mounting block, the diameter of the pin-hole being substantially equal to an outer diameter of the first fastener; and
a second fastener received through the slot and then into a second hole defined by the surface of the mounting block, the slot being oriented such that the second fastener constrains rotation of the face plate about a center of the pin-hole to align the first portion of the first blind-mate connector to a second portion of the first blind-mate connector.

2. The apparatus of claim 1, wherein the diameter of the pin hole and the long dimension are each less than or equal to 0.5 inches.

3. The apparatus of claim 1, further comprising:
a second avionics processing canister coupled to the mounting block, the second avionics processing canister comprising a second face plate having a surface that defines a second pin-hole and a second slot, the second avionics processing canister further comprising a first portion of a second blind-mate connector.

4. The apparatus of claim 1, further comprising the second portion of the first blind-mate connector coupled to a display head, the second portion of the first blind-mate connector being coupled to the first portion of the first blind-mate connector.

5. The apparatus of claim 1, wherein the mounting block comprises a pre-existing mounting block of an aircraft.

6. The apparatus of claim 1, wherein the slot is fully surrounded by material of the faceplate.

7. The apparatus of claim 1, wherein the diameter of the pin-hole is substantially equal to an outer diameter of a threaded portion of the first fastener.

8. The apparatus of claim 1, wherein the first portion of the first blind-mate connector is in a fixed position relative to the faceplate.

9. The apparatus of claim 1, wherein the second portion of the first blind-mate connector is constrained to move linearly relative to the faceplate to engage the first portion of the first blind-mate connector.

10. The apparatus of claim 1, wherein the avionics processing canister is constrained to move linearly relative to the mounting block.

11. The apparatus of claim 1, further comprising:
a display head coupled to the second portion of the first blind-mate connector;
wherein the faceplate is between the mounting block and the display head.

12. The apparatus of claim 11, wherein the display head is constrained to move linearly relative to the faceplate, when the display head is engaged with the mounting block.

13. An apparatus, comprising:
an avionics processing canister coupled to a mounting block, the avionics processing canister comprising:
a face plate with a surface that defines a pin-hole and a slot, the slot having a short dimension substantially equal to a diameter of the pin-hole and a long dimension perpendicular to the short dimension, the long dimension being longer than the short dimension; and
a first portion of a first blind-mate connector;
a first fastener received through the pin-hole and then into a first hole defined by a surface of the mounting block, the diameter of the pin-hole being substantially equal to an outer diameter of the first fastener;
a second fastener received through the slot and then into a second hole defined by the surface of the mounting block, the slot being oriented such that the second fastener constrains rotation of the face plate about a center of the pin-hole to align the first portion of the first blind-mate connector to a second portion of the first blind-mate connector; and
a display adapter mount positioned between the mounting block and the face plate.

14. The apparatus of claim 13,
wherein the display adapter mount has a surface that defines a display adapter mount pin hole and a display adapter mount slot; and
further comprising:
a first screw inserted through the display adapter mount pin hole and then into a first threaded hole defined by the surface of the mounting block; and
a second screw inserted through the display adapter mount slot and then into a second threaded hole defined by the surface of the mounting block, the display adapter mount slot having a short dimension substantially equal to a diameter of the display adapter mount pin-hole and a long dimension perpendicular to the short dimension, the display adapter mount slot being oriented such that the second screw constrains rotation of the display adapter mount about a center of the display adapter mount pin-hole.

15. The apparatus of claim 13, wherein the second portion of the first blind-mate connector is constrained to move linearly relative to the faceplate to engage the first portion of the first blind-mate connector.

16. An apparatus, comprising:
an avionics processing canister coupled to a mounting block, the avionics processing canister comprising:
a face plate having a surface that defines a pin-hole and a slot, the slot having a short dimension substantially equal to a diameter of the pin-hole and a long dimension perpendicular to the short dimension, the long dimension being longer than the short dimension; and
a first portion of a first blind-mate connector;
a display adapter mount positioned between the mounting block and the face plate;
a first fastener received through the pin-hole and then into a first hole defined by a surface of the mounting block, the pin-hole having a diameter substantially equal to an outer diameter of the first fastener;
a second fastener received through the slot and then into a second hole defined by the surface of the mounting block, the slot being oriented such that the second fastener constrains rotation of the face plate about a center of the pin-hole to align the first portion of the first blind-mate connector to a second portion of the first blind-mate connector; and a second avionics processing canister coupled to the mounting block and comprising a first portion of a second blind-mate connector.

17. The apparatus of claim 16, wherein the diameter of the pin hole and the long dimension are each less than or equal to 0.5 inches.

18. The apparatus of claim 16, wherein the display adapter mount has a surface that defines a display adapter mount pin hole and a display adapter mount slot, and further comprising:
a first screw inserted through the display adapter mount pin hole and then into a first threaded hole defined by the surface of the mounting block; and
a second screw inserted through the display adapter mount slot and then into a second threaded hole defined by the surface of the mounting block, the display adapter mount slot having a short dimension substantially equal to a diameter of the display adapter mount pin-hole and a long dimension perpendicular to the short dimension, the display adapter mount slot being oriented such that the second screw constrains rotation of the display adapter mount about a center of the display adapter mount pin-hole.

19. The apparatus of claim 16, further comprising the second portion of the first blind-mate connector coupled to a display head, the second portion of the first blind-mate connector being coupled to the first portion of the first blind-mate connector.

20. The apparatus of claim 16, wherein the mounting block comprises a pre-existing casting of an aircraft.

* * * * *